United States Patent [19]

Nishimura

[11] Patent Number: 5,359,295
[45] Date of Patent: Oct. 25, 1994

[54] POWER AMPLIFIER
[75] Inventor: Yasushi Nishimura, Tokyo, Japan
[73] Assignee: Pioneer Electronic Corporation, Tokyo, Japan
[21] Appl. No.: 29,230
[22] Filed: Mar. 9, 1993
[30] Foreign Application Priority Data
  Apr. 9, 1992 [JP] Japan .................................. 4-089098
[51] Int. Cl.⁵ .............................................. H03F 3/18
[52] U.S. Cl. .................................. 330/263; 330/262; 330/288; 330/310; 330/311; 330/295
[58] Field of Search ............... 330/263, 262, 288, 310, 330/311, 295
[56] References Cited

U.S. PATENT DOCUMENTS 4,454,479  6/1984  Spires .................................. 330/263

FOREIGN PATENT DOCUMENTS 61-41293  11/1986  Japan .

Primary Examiner—William L. Sikes
Assistant Examiner—Jim Dudek
Attorney, Agent, or Firm—Sughrue, Mion, Zinn, Macpeak & Seas

[57] ABSTRACT

A power amplifier is provided, wherein the output of a first transistor supplied with an input signal at the base thereof is supplied to the base of a second transistor, a current proportional to a collector current of the second transistor is supplied to the emitter of the first transistor by a current mirror circuit, a third transistor is provided for outputting an emitter current in accordance with a base-to-emitter voltage of the second transistor, and emitter currents of the second and third transistors, in accordance with an emitter potential level of the first transistor, is used as an output current. This configuration allows non-linear portions in the transistor characteristics to be cancelled by each other, thereby providing a power amplifier which presents a good linearity.

5 Claims, 3 Drawing Sheets

– 5,359,295 –

POWER AMPLIFIER

BACKGROUND OF THE INVENTION

1. Field of the Invention

The present invention relates to a power amplifier for reducing non-linear distortion.

2. Description of the Related Background Art

In a single ended push-pull (SEPP) circuit, since the $V_{BE}-I_C$ characteristic presents an exponential change, if this type of circuit is used as a power amplifier, distortion may occur. Conventionally, a voltage gain at a previous stage has been utilized to perform negative feedback (NFB) to remove such distortion, thereby improving the distortion ratio.

However, if a load impedance cannot be specifically known as in the case of an audio amplifier, performing NFB from an output may result in difficulties in ensuring the stability of a NFB loop system.

Thus, for providing a power amplifier which presents a low distortion ratio without NFB from an output, there is an amplifier which reduces distortion at a previous stage. An amplifier suitable for use in such a previous stage may be such one that is disclosed in Japanese Patent publication No. 61-41293. In this amplifier, as shown in FIG. 1, a PNP transistor $Q_1$ having the base applied with an input signal is operated as an emitter follower, and the output signal from the emitter follower is used as an input to the base of an NPN transistor $Q_2$. Then, these transistors $Q_1$, $Q_2$ in conductive types reverse to each other are supplied with currents $i_1$ and $i_2$, always in a fixed ratio relationship, by a current mirror circuit formed by transistors $Q_3$, $Q_4$, and resistors $R_2$, $R_3$. Incidentally, an emitter resistor $R_1$ is arranged between the emitter of the transistor $Q_2$ and the ground to define a circuit current. Also, a transistor $Q_5$ is provided to obtain an output of this circuit, and has the base commonly connected with the base of the transistor $Q_3$ to form a current mirror circuit. The current mirror circuit applies the resistor $R_5$ with a current output which maintains a fixed ratio to a current flowing through the transistor $Q_2$. An output transistor is further connected to the output of the amplifier to constitute a power amplifier. When the amplifier is used as an audio amplifier, the output stage is generally formed by a complementary SEPP.

However, in order to supply a load with a stable current from the output of the previous stage, the conventional power amplifier as described above requires an output stage such as an emitter follower to be connected thereto such that its output current is supplied to the load, which results in a problem that the number of elements constituting the power amplifier is increased and hence the circuit arrangement becomes complicated. Also, the distortion generated by transistors in the output stage has still been a problem.

SUMMARY OF THE INVENTION

It is therefore an object of the present invention to provide a power amplifier which is capable of having a good linear amplifying characteristic in a relatively simple construction.

The power amplifier according to the present invention comprises: a first transistor for receiving an input signal at the base thereof; a second transistor in a conductive type reverse to that of said first transistor, having a base coupled to receive the output of said first transistor; current supplying means for supplying the emitter of said first transistor with a current proportional to a collector current of said second transistor; and output means for generating an output in accordance with a current output from the emitter of said second transistor, wherein said output means has a third transistor for outputting an emitter current in accordance with a base-to-emitter voltage of said second transistor, and a total of emitter currents of said second and third transistors is used as an output current of said power amplifier.

In the power amplifier of the present invention, the output of the first transistor supplied with an input signal at the base thereof is supplied to the base of the second transistor, the current proportional to the collector current of the second transistor is supplied to the emitter of the first transistor by a current mirror circuit, and the emitter currents of the second and third transistors, in accordance with an emitter potential level of the first transistor, is used as an output current.

DESCRIPTION OF THE PREFERRED EMBODIMENTS

Embodiments of the present invention will hereinafter be described in detail with reference to the accompanying drawings.

Figure 1:
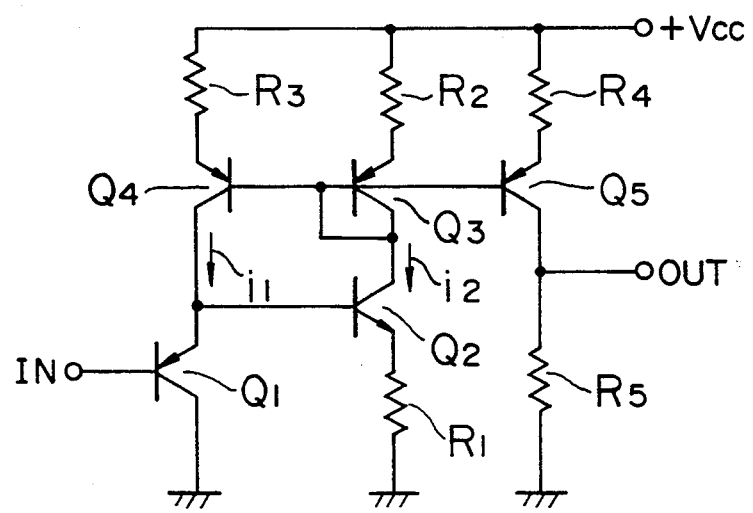
FIG. 1 is a circuit diagram showing the arrangement of a conventional power amplifier.
Figure 2:
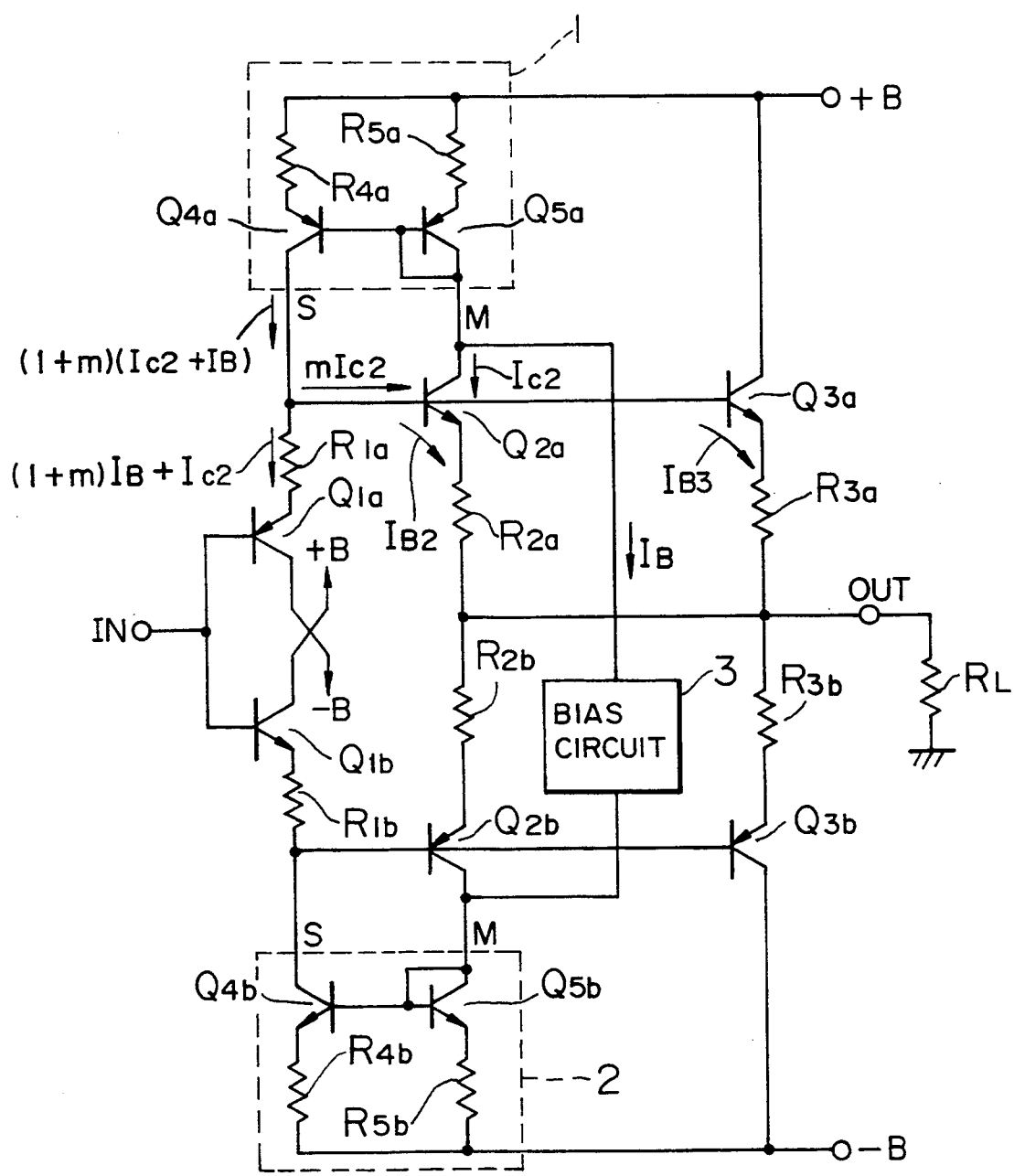
FIG. 2 is a circuit diagram showing an embodiment of the present invention.

FIG. 2 shows a power amplifier according to the present invention. In the power amplifier, first transistors $Q_{1a}$, $Q_{1b}$ in emitter-follower configuration, respectively having the bases connected to an input terminal IN, are in a complementary relationship with each other. The PNP transistor $Q_{1a}$ has the collector connected to a power source $-B$, and the emitter connected to a slave terminal S of a current mirror circuit 1 through an emitter resistor $R_{1a}$. The NPN transistor $Q_{1b}$ has the collector connected to a power source $+B$ and the emitter connected to a slave terminal S of a current mirror circuit 2 through an emitter resistor $R_{1b}$. The slave terminal S of the current mirror 1 is connected to the respective bases of a second transistor $Q_{2a}$ and a third transistor $Q_{3a}$. The transistor $Q_{2a}$ is an NPN transistor for driving and has the collector connected to a master terminal M of the current mirror circuit 1 and the emitter connected to an output terminal OUT through an emitter resistor $R_{2a}$. The third transistor $Q_{3a}$ as an output transistor is an NPN transistor which has the collector connected to the power source $+B$ and the emitter connected to the output terminal OUT through an emitter resistor $R_{3a}$. The slave terminal S of the current mirror circuit 2 is connected to the respective bases of a driving transistor $Q_{2b}$ and an output transistor $Q_{3b}$. In other words, the output signal of the transistor $Q_{1a}$ is applied to the bases of the transistors $Q_{2a}$, $Q_{3a}$. The second transistors $Q_{2a}$, $Q_{2b}$ and the third transistors $Q_{3a}$, $Q_{3b}$ are respectively in a complementary relationship with each other. The transistors $Q_{2b}$, $Q_{3b}$ are arranged symmetrically to the transistors $Q_{2a}$, $Q_{3a}$, wherein the PNP transistor $Q_{2b}$ has the collector connected to a master terminal M of the current mirror circuit 2 and the emitter connected to an output terminal OUT through an emitter resistor $R_{2b}$. The PNP transistor $Q_{3b}$ has the collector connected to the power source $-B$, and the emitter connected to the output terminal OUT through an emitter resistor $R_{3b}$. It should be noted that although the first and second transistors are of reverse conductive types to each other, they are the same in characteristics.

The current mirror circuit 1 is formed by transistors $Q_{4a}$, $Q_{5a}$ and resistors $R_{4a}$, $R_{5a}$, while the current mirror circuit 2 is formed by transistors $Q_{4b}$, $Q_{5b}$ and resistors $R_{4b}$, $R_{5b}$. A bias circuit 3 is connected between the master terminals M of the respective current mirror circuits 1 and 2. The bias circuit 3 comprises a known regulated current circuit and operates as a start-up circuit upon power-on.

The operation of the power amplifier thus constructed will next be explained.

During a no-signal period in which no audio signal is supplied to the input terminal IN, a current flows from the master terminal M of the current mirror circuit 1 to the collector of the transistor $Q_{2a}$ and the bias circuit 3. Specifically, assuming that a bias current flowing through the bias circuit 3 is $I_B$ and a collector current flowing through the collector of the transistor $Q_{2a}$ is $I_{C2}$, a current $I_{C2}+I_B$ flows. It should be noted that upon turning on the power supply, the bias current $I_B$ first flows to activate the circuit operation. The current $I_{C2}+I_B$ is multiplied by $(1+m)$ by the current mirror effect of the current mirror circuit 1 and output from the slave terminal S of the current mirror circuit 1. The output current of the current mirror circuit 1 flows into the emitter of the transistor $Q_{1a}$ through the emitter resistor $R_{1a}$. A terminal potential level of the emitter resistor $R_{1a}$ on the side of the slave terminal S is applied to the bases of the transistors $Q_{2a}$, $Q_{3a}$ to control the respective collector-to-emitter currents. The above mentioned value m is not more than 1, and a total of currents $I_{B2}$, $I_{B3}$ respectively flowing into the bases of the transistors $Q_{2a}$, $Q_{3a}$ is $mI_{C2}$.

During a no-signal period, since a total of a voltage applied to the resistor $R_{1a}$ and a base-to-emitter voltage of the transistor $Q_{1a}$ is equal to a total of a base-to-emitter voltage of the transistor $Q_{2a}$ and a voltage applied to the resistor $R_{2a}$, the following $$\{(1+m)I_B + I_{C2}\}R_{1a} + V_T\ln\frac{(1+m)I_B + I_{C2}}{I_{SD}} = I_{C2}R_{2a} + V_T\ln\frac{I_{C2}}{I_{SD}} \quad (1)$$

where $V_T$ represents a thermo-electromotive voltage, and $V_T = kT/q$ is satisfied, where k represents a Boltzmann constant; T an absolute temperature; and q a charge of electron. Also, $I_{C2}=I_{C2}+I_{B2}$, $I_{SD}$ is a saturation current of the transistors $Q_{1a}$, $Q_{2a}$.

In the above equation (1), the exponential function sections on both sides represent a base-to-emitter voltage $V_{BE1}$ of the transistor $Q_{1a}$ on the left side and a base-to-emitter voltage $V_{BE2}$ of the transistor $Q_{2a}$ on the right side. Originally, these voltages are low values of approximately 0.6 volts. Further, under the condition that $I_{C2}>(1+m)I_B>>I_{SD}$ is satisfied, the difference therebetween is small enough to be ignored, so that the equation (1) may be rewritten as follows:

$$\{(1+m)I_B + I_{C2}\}R_{1a} \approx I_{C2}R_{2a} \quad (2)$$

Therefore, the collector current $I_{C2}$ of the transistor $Q_{2a}$ is expressed by:

$$I_{C2} \approx R_{1a}(1+m)I_B/(R_{2a}-R_{1a}) \quad (3)$$

In the relationship between the transistors $Q_{2a}$ and $Q_{3a}$, since voltages between the respective bases and the output terminal OUT are equal to each other, the following equation is satisfied:

$$V_T\ln\frac{I_{E2}}{I_{SD}} + R_{2a}I_{E2} = V_T\ln\frac{I_{E3}}{I_{SP}} + R_{3a}I_{E3} \quad (4)$$

where $I_{E2}$, $I_{E3}$ represent emitter currents of the transistors $Q_{2a}$, $Q_{3a}$, respectively, and $I_{SP}$ a saturation current of the transistor $Q_{3a}$. When transforming the equation (4), the following equation (5) is derived:

$$V_T\ln\frac{I_{E2}I_{SP}}{I_{SD}I_{E3}} + R_{2a}I_{E2} - R_{3a}I_{E3} = 0 \quad (5)$$

Incidentally, it is assumed that in the equations (4) and (5) direct current amplifying ratios $h_{FE}$ of the emitter-grounded transistors $Q_{2a}$, $Q_{3a}$ are sufficiently large, and $I_{E2}=I_{C2}$ and $I_{E3}=I_{C3}$ are satisfied.
If $$I_{E3}=gI_{E2} \quad (6)$$

is satisfied at an arbitrary current value between the emitter currents $I_{E2}$ and $I_{E3}$, the equation (6) is substituted for the equation (5) to derive the following equation:

$$V_T\ln\frac{I_{SP}}{gI_{SD}} + I_{E2}(R_{2a} - gR_{3a}) = 0 \quad (7)$$

A condition for the equation (7) to be always satisfied irrespective of the value of the emitter current $I_{E2}$ that the exponential function section and the first order function section are always 0(zero). Therefore, from $$R_{2a}=gR_{3a} \quad (8)$$

$$g=R_{2a}/R_{3a} \quad (9)$$

is satisfied.
Also, from $$V_T\ln\frac{I_{SP}}{gI_{SD}} = 0 \quad (10)$$

$$I_{SP} = gI_{SD}$$

is satisfied.

Therefore, from the equations (9) and (10), the value of g may satisfy the following equation in order to linearly amplify a current:

$$g=I_{SP}/I_{SD}=R_{2a}/R_{3a} \quad (11)$$

Since $I_{SD}$, $I_{SP}$ are values inherent to the transistors $Q_{2a}$, $Q_{3a}$, if the specifications of the transistors $Q_{2a}$, $Q_{3a}$ are determined, the value of g is derived from the equation (11), from which the ratio of the resistors $R_{3a}$ are clarified. From this ratio, the collector currents $I_{C2}$, $I_{C3}$ during a no-signal period is determined. The respective current values and the values of m and g are set, for example, in the following manner. $I_B=10$ mA, $I_{B2}=1$ mA, $I_{B3}=10$ mA, $mI_{C2}=11$ mA, $I_{C2}=29$ mA, $I_{C3}=690$ mA, $m=11/29$, $g=(690+10)/(29+1)$ Explanation will next be given of a transfer conductance $G_m$ which is the voltage-to-current transforming characteristic in a power amplifier. First, assuming in a portion formed by the transistors $Q_{1a}$, $Q_{2a}$ and the current mirror circuit 1 that a signal voltage at the input terminal IN is Vin, a signal voltage at the output terminal OUT, i.e., a voltage applied to a load $R_L$ is Vout, the following equation is satisfied:

$$Vin + V_{BE1} + R_{1a}I_{C1} - V_{BE2} - R_{2a}I_{C2} = Vout \quad (12)$$

In this equation (12), since $V_{BE1} \approx V_{BE2}$ is satisfied as described above, $V_{BE1}$ and $V_{BE2}$ are canceled by each other. If the collector current $I_{C1}$ of the transistor $Q_{1a}$ is assumed to be equal to the emitter current of the same, $I_{C1} = (1+m)I_B + I_{C2}$ stands, where since $(1+m)I_B$ is a constant, alternate current changing portions in the currents $I_{C1}$, $I_{C2}$ become equal. Assuming the alternate current changing portion is represented by $\Delta I_C$, the following equation is derived from the equation (12):

$$Vin - Vout = (R_{2a} - R_{1a})\Delta I_C \quad (13)$$

The transfer conductance G representing a favorable degree of the amplifying characteristic of a power amplifier is a ratio of the difference between input and output voltages to the alternate current changing portion, so that the transfer conductance $G_{m1}$ in this portion is expressed by:

$$G_{m1} = \Delta I_C/(Vin - Vout) = 1/(R_{2a} - R_{1a}) \quad (14)$$

Stated another way, a non-linear portion due to the $V_{BE} - I_C$ characteristic possessed by a transistor is cancelled, and the transfer conductance is determined only by an emitter resistance. Also, in addition to $I_{C2}$, the current $I_{C3}$ proportional to $I_{C2}$ (g times as much) is supplied to the load $R_L$ by the transistor $Q_{3a}$, so that the transfer conductance $G_{m1}$ is multiplied by $1+g$. Further, since the power amplifier circuit is in a push-pull configuration, the transfer conductance $G_{m1}$ is again doubled when operated in class A, whereby the transfer conductance $G_m$ for the whole circuit is expressed by:

$$G_m = 2(1+g)/(R_{2a} - R_{1a}) \quad (15)$$

Since this transfer conductance $G_m$ has no term indicating non-linearity, the power amplification can be performed with a linear characteristic.

From the foregoing, a voltage gain of the power amplifier according to the present invention is expressed by:

$$Av = G_m R_L/(1 + G_m R_L) \quad (16)$$

Since the transfer conductance $G_m$ is a large value, the voltage gain Av is about 1. On the other hand, assuming that the alternate current amplifying ratio of the transistors $Q_{1a}$, $Q_{1b}$, $Q_{2a}$, $Q_{2b}$ is $h_{fe}$, a current gain Ai is expressed by:

$$Ai = 2(1+g)h_{fe} \quad (17)$$

It should be noted that this current gain Ai is true in the case of class A operation and decreased to half in the case of class B operation.

Incidentally, in the embodiment described above, the slave terminals S of the current mirror circuits 1, 2, i.e., the emitter outputs of the first transistors are directly connected to the bases of the respective second and third transistors. Alternatively, the connection may be made through a resistor to the base of each transistor. Also, a plurality of third transistors and emitter resistors therefor may be connected in parallel for providing a higher output.

Figure 3:
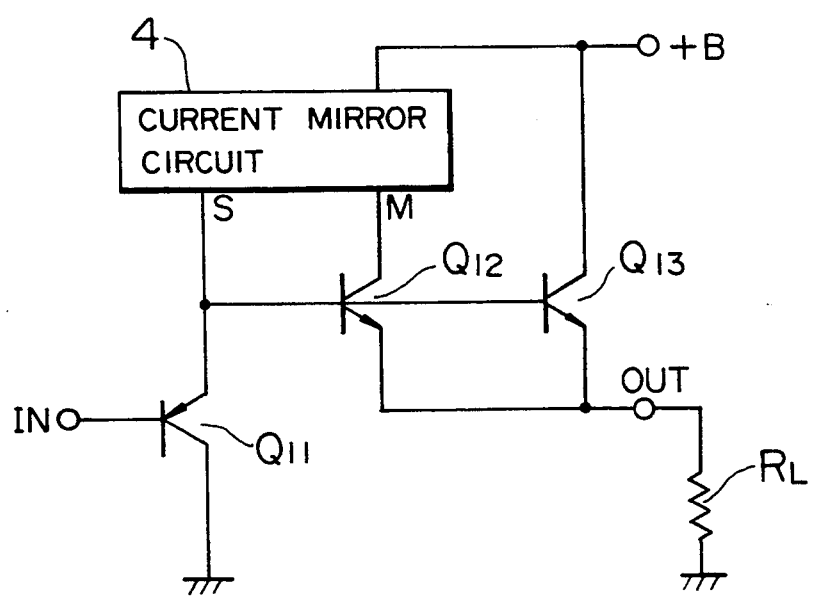
FIG. 3 is a circuit diagram showing another embodiment of the present invention.

Also, although in the embodiment described above, the power amplifier is formed as a SEPP (Single Ended Push-Pull) type amplifier circuit, it should be understood that the present invention may be formed as a single amplifier circuit. FIG. 3 shows an example of a circuit arrangement when the present invention is formed as such a single amplifier circuit.

In a power amplifier shown in FIG. 3, the collector of a first transistor $Q_{11}$, having the base connected to an input terminal IN, is grounded. The emitter of the transistor $Q_{11}$ is connected to a slave terminal S of a current mirror circuit 4 as well as the bases of second and third transistors $Q_{12}$, $Q_{13}$. The current mirror circuit 4 is constructed similarly to the current mirror circuit 1 of the amplifier shown in FIG. 2. Also, the collector of the second transistor $Q_{12}$ is connected to a master terminal M of the current mirror circuit 4. The third transistor $Q_{13}$ has the collector connected to a power source +B and the emitter connected to an output terminal OUT together with the emitter of the second transistor $Q_{12}$.

In the single type power amplifier as described above, a collector current of the transistor $Q_{11}$ flows into the ground, and an emitter current of the transistor $Q_{12}$ flows into a load $R_L$ through the output terminal OUT in accordance with an emitter potential level of the transistor $Q_{11}$. Also an emitter current of the transistor $Q_{13}$ flows into the load $R_L$ in accordance with a base-to-emitter voltage of the transistor $Q_{12}$. Since the specific operation of this power amplifier is substantially similar to that of the SEPP type shown in FIG. 2, further detailed explanation thereof will be omitted.

According to the present invention as described above, non-linear portions on characteristics of transistors are cancelled by each other, thereby providing a power amplifier which presents a good linearity. Also, since an amplified output of a signal supplied to the base of the first transistor is taken from the emitters of the second and third transistors, a stable current can be supplied to a load in a configuration simpler than conventional power amplifiers.

What is claimed is:

1. A power amplifier comprising:
    a first transistor for receiving an input signal at a base thereof;
    a second transistor in a conductive type reverse to that of said first transistor, having a base coupled to a emitter of said first transistor through a first resistor and an emitter coupled to a second resistor;
    current supplying means for supplying the coupled point of said first resistor and the base of said second transistor with a current proportional to a collector current of said second transistor;
    an output stage having a third transistor for outputting through a third resistor an emitter current in accordance with a base-to-emitter voltage of said second transistor; and
    output means for outputting a total of currents flowing through said second and third resistors as an output current of said power amplifier.

2. A power amplifier according to claim 1 wherein said current supplying means comprises a current mirror circuit.

3. A power amplifier according to claim 1, wherein said output stage comprises a plurality of transistors connected in parallel.

4. A power amplifier according to claim 1, wherein at least one of said second transistor and said third transistor has at least one of a base resistor and an emitter resistor.

5. A power amplifier according to claim 1 which is formed by a complementary circuit perforating a push-pull operation.

* * * * *